(12) United States Patent
Yao et al.

(10) Patent No.: US 12,044,640 B2
(45) Date of Patent: Jul. 23, 2024

(54) METHOD FOR SELECTIVELY DETECTING DOPAMINE BASED ON MAGNETIC RESONANCE NUCLEAR SPIN SINGLET STATE

(71) Applicant: EAST CHINA NORMAL UNIVERSITY, Shanghai (CN)

(72) Inventors: Yefeng Yao, Shanghai (CN); Jiaxiang Xin, Shanghai (CN); Huixia Liu, Shanghai (CN); Daxiu Wei, Shanghai (CN)

(73) Assignee: EAST CHINA NORMAL UNIVERSITY, Shanghai (CN)

( * ) Notice: Subject to any disclaimer, the term of this patent is extended or adjusted under 35 U.S.C. 154(b) by 554 days.

(21) Appl. No.: 17/295,560

(22) PCT Filed: Nov. 29, 2019

(86) PCT No.: PCT/CN2019/121856
§ 371 (c)(1),
(2) Date: May 20, 2021

(87) PCT Pub. No.: WO2020/108592
PCT Pub. Date: Jun. 4, 2020

(65) Prior Publication Data
US 2022/0003697 A1 Jan. 6, 2022

(30) Foreign Application Priority Data

Nov. 30, 2018 (CN) .......................... 201811450785.7

(51) Int. Cl.
*G01N 24/08* (2006.01)

(52) U.S. Cl.
CPC .................................. *G01N 24/087* (2013.01)

(58) Field of Classification Search
CPC ............................................ G01N 24/087–088
USPC ................................................... 324/307–315
See application file for complete search history.

(56) References Cited

FOREIGN PATENT DOCUMENTS

| CN | 106932426 A | 7/2017 |
| CN | 109521038 A | 3/2019 |
| WO | WO 2010/014893 A2 | 2/2010 |

OTHER PUBLICATIONS

Lin et al.; Translation of CN 106932426 A; Pub. Date Jul. 7, 2017; Translated by EPO & Google (Year: 2017).*

(Continued)

*Primary Examiner* — Steven L Yeninas
*Assistant Examiner* — Rahul Maini
(74) *Attorney, Agent, or Firm* — Birch, Stewart, Kolasch & Birch, LLP

(57) ABSTRACT

A method uses the nuclear spin singlet of three hydrogen atoms on the dopamine benzene ring to achieve selective detection of dopamine signals in a complicated system. The present invention is based on magnetic resonance technology to detect dopamine, has good accuracy, sensitivity and selectivity, can accurately detect the signal of dopamine from the complicated system, and the interference of signals of other substances are well eliminated. Meanwhile, the present invention further has the advantages of simple operation and non-intervention, can be used for monitoring the content and distribution of the dopamine in a living body, and has important application value in the fields of biology and medicine.

10 Claims, 2 Drawing Sheets

(56) References Cited

OTHER PUBLICATIONS

International Search Report issued in PCT/CN2019/121856 (PCT/ISA/210), dated Feb. 26, 2020.
Written Opinion of the International Searching Authority issued in PCT/CN2019/121856 (PCT/ISA/237), dated Feb. 26, 2020.

* cited by examiner

METHOD FOR SELECTIVELY DETECTING DOPAMINE BASED ON MAGNETIC RESONANCE NUCLEAR SPIN SINGLET STATE

TECHNICAL FIELD

The present invention relates to the technical field of magnetic resonance, in particular to a method for selectively detecting dopamine molecules based on magnetic resonance nuclear spin singlet, which realizes the selective observation of the $^1H$ NMR signals of dopamine.

BACKGROUND OF THE INVENTION

Dopamine is an important neurotransmitter in the brain. It participates in many physiological and pathological activities of humans and mammals, especially plays a crucial role in movement regulation, learning and memory, and drug addiction. Usually, the neurotransmitter such as dopamine is produced by the neurons those are also called dopaminergic neurons. An approach like the "returning satellite" is adopted to manage the released dopamine, ensuring that the amount of the released dopamine exactly fits the need of brain activity. At the same time, the dopamine transporters are activated as the dopamine "recycling pump" to recycle the released dopamine in a timely and appropriate amount. This not only achieves the purpose of regulating the concentration of extracellular dopamine and adapting to the needs of physiological activities, but also enables dopamine to be reused for energy saving and efficiency enhancement. However, once the dopamine "recycling pump" system is dysfunctional, a variety of central nervous system diseases will occur, such as drug addiction.

At present, the detection methods of dopamine mainly include the flow injection chemiluminescence, the high performance liquid chromatography, and the fluorescence method. These methods all require a complicated pre-treatment process and cannot be used in the in-vivo detection of dopamine in a living organism.

SUMMARY OF THE INVENTION

The purpose of the present invention is to provide a method for selectively detecting dopamine molecules based on magnetic resonance nuclear spin singlet. This method has good accuracy, sensitivity and selectivity, and can accurately detect dopamine signals from a system with complex components, and meanwhile can well eliminate the interference of signals of the other substances.

The specific technical solution to achieve the purpose of the present invention is as follows:

Step A: Obtain the chemical shifts and J coupling values of the three $^1H$ spins on the benzene ring of dopamine in the test sample;

Step B: According to the spin characteristics of dopamine, design a pulse sequence that utilizes the nuclear spin singlet states to realize the selection of dopamine signals;

Step C: By the designed pulse sequence, prepare the spin singlet states of the three $^1H$ spin coupling system on the benzene ring of dopamine. During the existence of the spin singlets, the gradient field pulse is applied to remove the other signals except the spin singlet in the sample, resulting in the targeting selection of dopamine signal.

The purpose of Step A is to obtain the nuclear spin coupling characteristics of dopamine molecules. It can usually be obtained by analyzing the NMR spectrum of the sample. For example, FIG. 1 and FIG. 2 show the $^1H$ spectra of dopamine. By analyzing the spectra, the chemical shifts and J coupling values of the three $^1H$ spins on the benzene ring of the dopamine molecule can be obtained. The pulse sequence involved in the present invention needs to be designed based on the characteristics of the spin coupling system.

The pulse sequence designed in Step B should contain the module to prepare the spin singlets of the nuclear spin coupling system of dopamine and the module to transform the spin singlets to the observable signals, and the gradient field pulses during the evolution of the nuclear spin singlet to remove all of the other signals except the nuclear singlet. FIG. 3 shows a pulse sequence that can be used to prepare the spin singlets of dopamine. In this pulse sequence, firstly, a 90-degree hard pulse is applied along the x direction. After a delay time of $\tau_1$, a 180-degree hard pulse is applied along the x direction. Then, a delay time of $(\tau_1+\tau_2)$ is applied, followed by a 90-degree hard pulse along the y direction, and then a delay time of $\tau_3$ is applied. After $\tau_3$, a delay time of $\tau_4$ is given, followed by a 90-degree hard pulse along the y direction, and then a delay time of $\tau_5$ is applied.

In this pulse sequence, the values of $\tau_1$, $t_2$, $\tau_3$ can affect the efficiency of the singlet preparation of the three $^1H$ spins on the benzene ring of dopamine. In order to maximize the singlet preparation efficiency, optimization of $\tau_1$, $\tau_2$, $\tau_3$ is required. $\tau_4$ and $\tau_5$ are related to the dopamine signals for the final detection. In order to maximize the final detection signals, $\tau_4$ and $\tau_5$ need to be optimized too. FIG. 4 shows the spectrum obtained using the pulse sequence of FIG. 3. The sample is a dopamine aqueous solution sample.

The pulse sequence in FIG. 5 shows a way of applying the gradient field pulses during the evolution of the nuclear spin singlets. In FIG. 5, from the start of the pulse sequence to the end of $\tau_3$ is the singlet preparation module. After this pulse sequence module, the first gradient field pulse, $g_1$, is applied. Then there is the singlet evolution stage. In the singlet evolution stage, a decoupling pulse can be applied. The purpose of the decoupling pulse is to minimize the influence of the environmental factors on the spin singlets evolution. To better remove all of the other NMR signals except the spin singlets, a second gradient field pulse $g_2$ can be applied after the decoupling period.

In Step C the three $^1H$ spin coupling system on the benzene ring of dopamine is prepared into the nuclear spin singlets. There are several multiple spin systems in a dopamine molecule. The spin system formed by the three $^1H$ on the benzene ring of dopamine can be effectively prepared for the nuclear spin singlets. Ethylamine of dopamine also has a spin coupling system. However, the efficiency of the singlet preparation of this spin coupling system is poor.

The present invention also provides a method for selectively detecting dopamine molecules based on magnetic resonance nuclear (NMR) spin singlet, comprises the following steps:

Steps 1: Put the $D_2O$ aqueous solution with a mass fraction of 2%-5% dopamine in the magnetic resonance instrument, and apply a 90-degree hard pulse to the $D_2O$ aqueous solution of dopamine, which makes the $^1H$ signals excited, obtain the $^1H$ spectrum of dopamine, and in turn the chemical shift of three $^1H$ on the benzene ring of dopamine and the J coupling values among the protons;

Steps 2: According to the pulse form of preparing the singlets from the two-spin system of the weakly coupled system, for the three-spin system consisting of three $^1H$ atoms on the benzene ring of dopamine, the pulse parameters for the preparation and detection of dopamine singlet in the three-spin system are calculated based on chemical shifts and J coupling values obtained from Step 1 by using MATLAB. As a result, the pulse sequence to prepare the nuclear spin singlet states with the maximum efficiency of three $^1$H atoms on the dopamine benzene ring can be obtained;

Steps 3: The complete pulse sequence is obtained by combining the pulse form to prepare the singlet of the two-spin system of the weakly coupled system and the pulse parameters required for the preparation and detection of dopamine singlet in the three-spin system calculated in Step 2. The obtained pulse sequence can be applied to the dopamine D$_2$O aqueous solution to prepare and detect the singlet of the three-spin system consisting of three $^1$H on the benzene ring;

Steps 4: On the basis of preparation and detection of dopamine singlet in Step 3, two gradient field pulses with different amplitudes and a continuous wave (CW) decoupling pulse are applied between the pulses for the singlet preparation and the pulses for the signal detection to form a new pulse sequence. The function of the new pulse sequence can be divided into three parts: the first part is to obtain the singlet states of the three $^1$H on the benzene ring of dopamine; the second part is to keep the singlet states of three $^1$H on the benzene ring of the dopamine and filter the other non-single state signals because the nuclear spin singlet state is not affected by the gradient field pulses and the CW decoupling pulse; the third part is to detect the singlet states of three $^1$H on the benzene ring; in the end, only the three $^1$H signals on the benzene ring are kept, achieving the purpose of selective signal filtering. In this process, it is necessary to continuously optimize the time of the CW pulse to achieve the best filtering efficiency.

As for the $^1$H spectrum of dopamine described in Step 1, the three signals on the left side represent the three $^1$H signals on the benzene ring, the single peak in the middle is the water signal, and the ethyl signal of dopamine is on the right side; the J coupling values and chemical shifts between the three $^1$H atoms on the benzene ring of dopamine are obtained from the $^1$H spectrum of dopamine.

Step 2 is as follows: firstly, a 90-degree hard pulse is applied along x direction, after a delay time of $\tau_1$, a 180-degree hard pulse is applied along the x direction; then, a delay time of $(\tau_1+\tau_2)$ is applied, followed by a 90-degree hard pulse along the y direction, and then a delay time of $\tau_2/2$ namely $\tau_3$ is applied; the function of this pulse is to prepare the singlet states of three $^1$H on the benzene ring of dopamine, which is called preparation pulse; because the singlet states cannot be directly detected, another pulse is needed to detect the singlets of the three $^1$H of three-spin system on the benzene ring of dopamine, which is called detection pulse; the form of detection pulse is as follows, after a delay time of $\tau_4$, followed by a 90-degree hard pulse along the y direction and then a delay time of $\tau_5$ is applied; next, take ADC sample immediately until the sampling signal decay is completed; in this process, the values of $\tau_1$ and $\tau_2$ impact the efficiency of the singlet states consisting of three $^1$H atoms on the benzene ring of dopamine; in order to maximize the efficiency of the singlet states, MATLAB software is used to calculate the values of $\tau_1$ and $\tau_2$; first of all, 64 basic operators of the three-spin system are constructed in the MATLAB script, and then the Hamiltonian of the three-spin system consisting of three $^1$H atoms on the benzene ring of dopamine is written; finally, the operating operators corresponding to the 90-degree hard pulse and the 180-degree hard pulse are obtained; then, the system is continuously evolving from the thermal equilibrium signals under the operating operator and Hamiltonian of the hard pulse, and the evolution time $\tau_1$ and $\tau_2$ are continuously optimized to maximize the singlet states preparation efficiency; similarly, on the basis of generating singlet states, evolution time $\tau_4$ and $\tau_5$ are optimized to maximize the singlet states detection efficiency; finally, the complete pulse to prepare and detect three-spin system singlet states of dopamine is obtained by combining the pulse form of the two-spin system singlet of the weakly coupled system and the calculated pulse parameters.

As described in Step 3, the singlet state of the three-spin system consisting of three $^1$H atoms on the benzene ring of dopamine is prepared and detected. Specifically, firstly, the complete pulse obtained in Step 2 is written into the computer by the NMR instrument language; secondly, a D$_2$O aqueous solution of dopamine is put into the magnetic resonance instrument, and then the field-locking, field-shimming, matching, and tuning are performed; finally, the radio frequency center of the transmitter is set to the three $^1$H on the benzene ring of dopamine, and the complete pulse written into the computer is applied to prepare and detect the singlet states of the dopamine.

As described in Step 4, the CW decoupling pulse and two gradient field pulses with different amplitudes are applied between the pulses for the singlet preparation and the pulses for the signal detection. This forms a new pulse module. Specifically, the duration of the CW pulse is between 50 ms and 1 s; the amplitude varies from 1 watt to 15 watts; the duration of each of the two gradient field pulses with different amplitudes along the z direction is between 1 ms and 5 ms, with the amplitude varying from 5 to 10 Gauss/cm. This new pulse module including the CW decoupling pulse and the two gradient field pulses with different amplitudes, is written into the computer by the NMR instrument language. Then, the routine procedures such as field-locking, field-shimming, matching, and tuning are performed; finally, the radio frequency center of the transmitter is set to the three $^1$H on the dopamine benzene ring, and the new pulse sequence which has been written into the computer including the CW decoupling pulse and the two gradient field pulses with different amplitudes is applied to prepare and detect the singlet states of dopamine.

Compared with the existing technology, the beneficial effects of the present invention are as follows:

The invention has good accuracy, sensitivity and selectivity and can accurately detect the dopamine signals from a system containing complex components. At the same time, it can eliminate the interference of the signals of the other substances in the sample. This invention also has the advantages of simple operation and non-intervention. It can be used to monitor the amount and distribution of dopamine in-vivo, and has important applications in the fields of biology and medicine.

Compared with the existing technologies, the present invention has the following advantages:

(1) The existing magnetic resonance technology cannot achieve selective observation of dopamine signals while suppressing all other signals in the sample;

(2) It can be applied to living organisms without the need to inject molecular probes into the organism, and can detect dopamine molecules in real-time and in vivo without damaging tissue cells;

(3) There is no need to separate the dopamine molecules in the tested sample, and it can be applied to the detection of dopamine in the mixture samples.

(4) There is no dependence on the field strength, as long as the J coupling values and the chemical shifts of the three $^1$H spins on the benzene ring of dopamine are obtained, the required parameters in the pulse sequence can be calculated by MATLAB, and the selective observation of dopamine can be realized.

(5) The method is simple. There is no need to damage the dopamine molecule, and selective detection of the dopamine molecules can be achieved by using the specific pulse sequence in an NMR instrument.

BRIEF DESCRIPTION OF THE DRAWINGS

In FIG. 3, the pulse sequence module from the start of the pulse sequence to the end of $\tau_3$ is the preparation module of the spin singlets of the nuclear spin coupling system of dopamine. The pulse sequence module from the beginning of $\tau_4$ to the end of $\tau_5$ is the module to transform the spin singlets to the observable signals.

DESCRIPTION OF THE PREFERRED EMBODIMENTS

The present invention will be further described in detail with the reference to the following specific examples and figures.

Example 1

NMR Instrument: Bruker AVANCE III 500 NMR spectroscopy.

The example was carried out as follows:

Step A: Analyze the $^1$H NMR spectrum of dopamine and make the signal assignment. In the $^1$H NMR spectrum of dopamine (see FIG. 1 and FIG. 2), if setting the center frequency between peaks 1 and 3 to zero, the resonance frequencies and J coupling values of peaks 1, 2 and 3 (i.e., the characteristics of the three $^1$H spin system of dopamine) are:

$\omega_1$=36.5 Hz, $\omega_2$=−7.8 Hz, $\omega_3$=−36.5 Hz;

$J_{12}$=0 Hz, $J_{13}$=8.14 Hz, $J_{23}$=2.18 Hz.

Step B: Design a pulse sequence that can be used to selectively detect the signals of dopamine molecules based on the nuclear spin singlets. According to the characteristics of the spin system of dopamine, the pulse sequence in FIG. 5 was designed. The core steps and ideas of the design of the pulse sequence are as follows: Firstly, the Pauli operator is used to construct the base operator of the three-spin system. Then according to the characteristics of the three $^1$H spin system of dopamine obtained in Step A (i.e., the three $^1$H resonance frequencies and the J coupling values), the spin Hamiltonians and the evolution operators of the three-spin system are as follows:

$$\hat{H} = \omega_1 \hat{I}_{1z} + \omega_2 \hat{I}_{2z} + \omega_3 \hat{I}_{3z} + 2\pi J_{12}\hat{I}_{1z}\hat{I}_{2z} + 2\pi J_{13}\hat{I}_{1z}\hat{I}_{3z} + 2\pi J_{23}\hat{I}_{2z}\hat{I}_{3z}$$

$$\hat{u}(\tau) = e^{-i\hat{H}\tau}$$

$$\hat{u}^*(\tau) = e^{i\hat{H}\tau}$$

wherein, $\omega_1$, $\omega_2$, $\omega_3$ represent the resonance frequencies of the three $^1$H spins on the benzene ring of dopamine. $\hat{I}_{1z}, \hat{I}_{2z}, \hat{I}_{3z}$ are the base operators along the z axis of the three-spin system. $\tau$ is the evolution time, $\hat{u}(\tau)$ is the evolution operator after $\tau$ time, $\hat{u}^*(\tau)$ is the transposed complex conjugate of $\hat{y}(\tau)$, and $\hat{H}$ is the spin system Hamiltonian.

The operator of the $\varphi$ degree hard pulse along the x direction is as follows:

$$\hat{u}_x(\varphi) = e^{-i*(\hat{I}_{1x}+\hat{I}_{2x}+\hat{I}_{3x})*\varphi}$$

$$\hat{u}^*_x(\varphi) = e^{i*(\hat{I}_{1x}+\hat{I}_{2x}+\hat{I}_{3x})*\varphi}$$

wherein, $\hat{I}_{1x}, \hat{I}_{2x}, \hat{I}_{3x}$ are the base operators along the x axis of the three-spin system, and $\hat{u}^*_x(\varphi)$ is the transposed complex conjugate of $\hat{u}_x(\varphi)$.

The three-spin system is in the thermal equilibrium at room temperature, and thus the density operator is as follows:

$$\hat{\rho}_0 = \hat{I}_{1z} + \hat{I}_{2z} + \hat{I}_{3z}$$

Figure 5:
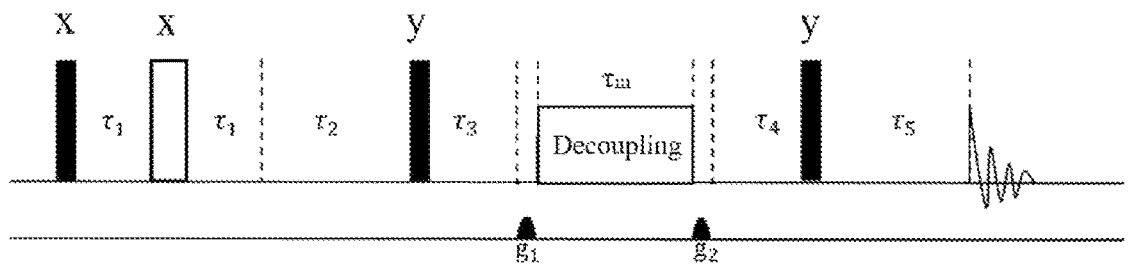
FIG. 5 is the scheme of the pulse after adding the gradient field pulse and the high power CW decoupling pulse on the basis of preparing and detecting singlet. The selected pulse sequence of dopamine signals is realized by using the nuclear spin singlet. The black rectangle represents a 90-degree pulse and the white square represents a 180-degree pulse. x and y represent the phases of the radio frequency (RF) pulses. $\tau_5$ is the time for the spin evolution. $\tau_m$ is the decoupling pulse time, and $g_1$ and $g_2$ represent the gradient field pulses.

The evolution process of the density operator corresponding to the pulse sequence in FIG. 5 is as follows:

1. After applying a 90-degree hard pulse along the x direction, the density operator can be written as:

$$\hat{\rho}_1 = \hat{u}_x\left(\frac{\pi}{2}\right)\hat{\rho}_0 \hat{u}_x^*\left(\frac{\pi}{2}\right)$$

2. After the evolution through time of $\tau_1$, the density operator becomes:

$$\hat{\rho}_2 = \hat{u}(\tau_1)\hat{\rho}_1\hat{u}^*(\tau_1)$$

3. After applying a 180-degree hard pulse along the x direction, the density operator becomes:

$$\hat{\rho}_3 = \hat{u}_x(\pi)\hat{\rho}_2\hat{u}^*_x(\pi)$$

4. After the evolution through time of $\tau_1+\tau_2$, the density operator becomes:

$$\hat{\rho}_4 = \hat{u}(\tau_1+\tau_2)\hat{\rho}_3\hat{u}^*(\tau_1+\tau_2)$$

5. After applying a 90-degree hard pulse along the y direction, the density operator becomes:

$$\hat{\rho}_5 = \hat{u}_y\left(\frac{\pi}{2}\right)\hat{\rho}_4\hat{u}_y^*\left(\frac{\pi}{2}\right)$$

6. After the evolution through time of $\tau_3$, the density operator becomes:

$$\hat{\rho}_6 = \hat{u}(\tau_3)\hat{\rho}_5\hat{u}^*(\tau_3)$$

After the evolution under the operation operators of Hamilton and the hard pulse, the target operator of the single state is:

$$\hat{Q} = \frac{1}{\sqrt{3}}(\hat{I}_{1x}\hat{I}_{3x} + \hat{I}_{1y}\hat{I}_{3y} + \hat{I}_{1z}\hat{I}_{3z}) + \frac{1}{\sqrt{3}}(\hat{I}_{2x}\hat{I}_{3x} + \hat{I}_{2y}\hat{I}_{3y} + \hat{I}_{2z}\hat{I}_{3z})$$

The trace of the product of $\hat{\rho}_6$ and the target operator $\hat{Q}$ yields the singlet conversion efficiency, S:

$$S = \mathrm{trace}(\hat{Q}\hat{\rho}_6)$$

To maximize the singlet conversion efficiency, $\tau_1$, $\tau_2$, and $\tau_3$ need to be optimized.

7. After the evolution through time of $\tau_3$, the gradient field pulse, $g_1$, is applied to remove all other signals except the spin singlets in the sample. The spin singlets are not affected by the gradient field pulse, $g_1$.

8. After the gradient field pulse, $g_1$, a decoupling pulse with a period of $\tau_m$ is applied to preserve the spin singlets in the sample.

9. After the decoupling pulse, the gradient field pulse, $g_2$, is applied to further suppress all other signals except the spin singlets in the sample.

Because the spin singlets cannot be directly detected in the NMR instrument, it needs to be converted into the observable signals. The signal evolution of the system after the gradient field pulse, $g_2$, is as follows:

10. After the evolution through time of $\tau_4$, the density operator becomes:

$$\hat{\rho}_7 = \hat{u}(\tau_4)\hat{Q}\hat{u}^*(\tau_4)$$

11. After applying a 90-degree hard pulse along the y direction, the density operator becomes:

$$\hat{\rho}_8 = \hat{u}_y\left(\frac{\pi}{2}\right)\hat{\rho}_7\hat{u}_y^*\left(\frac{\pi}{2}\right)$$

12. After the evolution through time of $\tau_5$, the density operator becomes:

$$\hat{\rho}_9 = \hat{u}(\tau_5)\hat{Q}\hat{u}^*(\tau_5)$$

If using the quantum state after the singlet preparation as the initial state, to have the best optimized singlet preparation efficiency, the target quantum state is:

$$\hat{P} = \tfrac{1}{2}(\hat{I}_{1x}\hat{I}_{3x} + \hat{I}_{1z}\hat{I}_{3x}) + \tfrac{1}{2}(\hat{I}_{2x}\hat{I}_{3x} + \hat{I}_{3x}\hat{I}_{2z})$$

The trace of the product of $\hat{\rho}_9$ and the target quantum state $\hat{P}$ yields the projection of the final state on the target quantum state:

$$R = \mathrm{trace}(\hat{P}\hat{\rho}_9)$$

wherein, R represents the observable signal transformed from the spin singlets. In order to achieve the maximum value of R, $\tau_4$ and $\tau_5$ need to be optimized.

Figure 6:
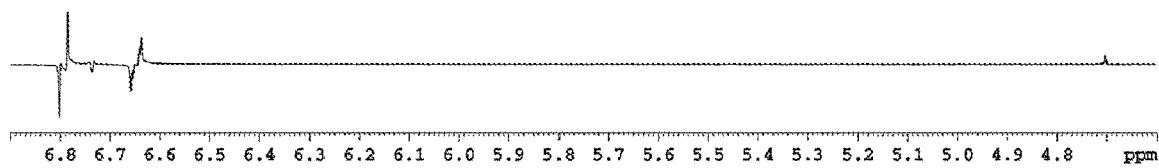
FIG. 6 is the $^1$H NMR spectrum of the dopamine aqueous solution sample. In Example 1 of the invention, after applying the gradient field pulses and high power CW decoupling pulse on the basis of the original pulse sequence, the $^1$H NMR spectrum is obtained by preparing and detecting the spin singlets of dopamine; the pulse sequence in FIG. 5 is used to acquire the spectrum. The water signal in the spectrum was significantly suppressed.

Step C: Use the pulse sequence designed in Step B to selectively detect the signals of dopamine. The experimental parameters need to be optimized. The optimized experimental parameters in this experiment are as follows: $\tau_1$=30.9 ms, $\tau_2$=6.8 ms, $\tau_3$=3.4 ms, $\tau_4$=6.8 ms, $\tau_5$=3.3 ms. The gradient field pulse, $g_1$, is applied along the z direction, the pulse length is 1 ms and the amplitude is 5 Gauss/cm. The direction, length, and power of the gradient pulse, $g_2$, is the same as $g_1$. A CW pulse is used as the decoupling pulse. The decoupling time is 100 ms, and the decoupling amplitude is 3 watts. The NMR spectrum in FIG. 6 is obtained by using the above parameters in the experiment. The sample is a dopamine deuterium aqueous solution (i.e. dopamine dissolved in $D_2O$).

This embodiment comprises the following steps:

The instrument used in this embodiment is Bruker AVANCE III 500 NMR spectroscopy.

The specific steps from the singlet preparation of dopamine to the realization of the filtering of dopamine signals are as follows:

Step 1: This embodiment is a system in which dopamine is dissolved in $D_2O$. Preparing an aqueous solution of dopamine with a mass fraction of 3%. In the NMR experiment, a 90-degree hard pulse is applied, obtaining the signal peaks of the dopamine $^1H$ spectrum shown in FIG. 1. Among them, the peaks of three protons on the dopamine benzene ring are at the far left, and the water peak is at the middle of the spectrum, the signal on the right is the ethyl signal of the dopamine molecule. Selecting the three $^1H$ peaks of the benzene ring in the dopamine structure as the target peaks (The labeled peaks 1, 2, and 3 on the $^1H$ spectrum is shown in FIG. 2). After setting the center frequency between peaks 1 and 3 to zero, the J coupling values between the protons of the system and their corresponding chemical shifts read as:

$$\omega_1 = 36.5\ \mathrm{Hz}, \omega_2 = -7.8\ \mathrm{Hz}, \omega_3 = -36.5\ \mathrm{Hz};$$

$$J_{12} = 0\ \mathrm{Hz}, J_{13} = 8.14\ \mathrm{Hz}, J_{23} = 2.18\ \mathrm{Hz}.$$

Step 2: Firstly, the Pauli operator is used to construct the base operator of the three-spin system. Then according to the chemical shifts and the J coupling values of the three $^1H$ spin system of dopamine obtained in Step 1, the spin Hamiltonians and the evolution operators of the three-spin system are as follows:

$$\hat{H} = \omega_1 \hat{I}_{1z} + \omega_3 \hat{I}_{2z} + \omega_3 \hat{I}_{3z} + 2\pi J_{12}\hat{I}_{1z}\hat{I}_{2z} + 2\pi J_{13}\hat{I}_{1z}\hat{I}_{3z} + 2\pi J_{23}\hat{I}_{2z}\hat{I}_{3z}$$

$$\hat{u}(\tau) = e^{-i\hat{H}\tau}$$

$$\hat{u}^*(\tau) = e^{i\hat{H}\tau}$$

Wherein, $\omega_1$, $\omega_2$, $\omega_3$ represent the values of the chemical shift of the three 41 spins on the benzene ring of dopamine respectively. $\hat{I}_{1z}, \hat{I}_{2z}, \hat{I}_{3z}$ are the base operators along the z axis of the three-spin system; T is the evolution time, $\hat{u}(\tau)$ is the evolution operator after $\tau$ time, $\hat{u}^*(\tau)$ is the transposed complex conjugate of $\hat{u}(t)$, and $\hat{H}$ is the Hamiltonian of the spin system.

Shown as an example, the operator of the 90-degree hard pulse along the x direction is as follows:

$$\hat{u}_x\left(\frac{\pi}{2}\right) = e^{-i*(\hat{I}_{1x}\hat{I}_{2x}+\hat{I}_{3x})*\frac{\pi}{2}}$$

$$\hat{u}_x^*\left(\frac{\pi}{2}\right) = e^{i*(\hat{I}_{1x}\hat{I}_{2x}+\hat{I}_{3x})*\frac{\pi}{2}}$$

Wherein, $\hat{I}_{1x}, \hat{I}_{2x}, \hat{I}_{3x}$ are the base operators along the x axis of the three-spin system, and $$\hat{u}_x^*\left(\frac{\pi}{2}\right)$$

is the transposed complex conjugate of $$\hat{u}_x\left(\frac{\pi}{2}\right).$$

The three-spin system is in the thermal equilibrium at room temperature, and thus the density operator is as follows:

$$\hat{\rho}_0 = \hat{I}_{1z} + \hat{I}_{2z} + \hat{I}_{3z}$$

Figure 1:
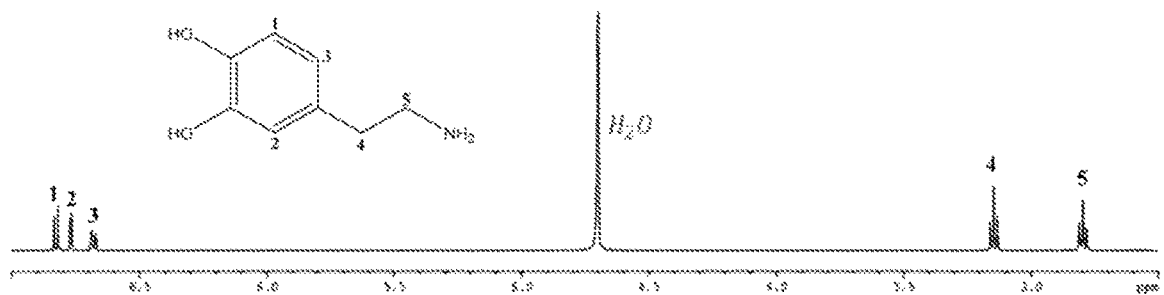
FIG. 1 is the molecular structure of dopamine and the $^1$H NMR spectrum of the dopamine aqueous solution sample.
Figure 2:
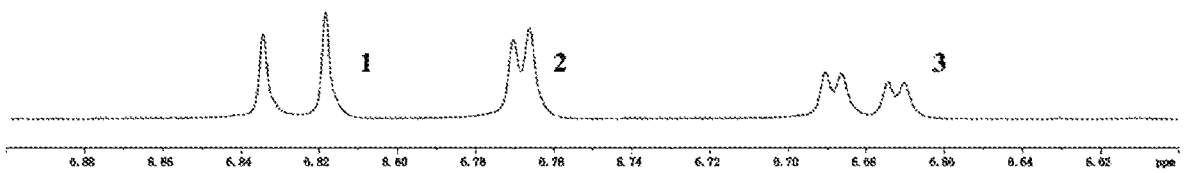
FIG. 2 is the $^1$H NMR spectrum of the three $^1$H spins on the benzene ring of dopamine aqueous solution sample to prepare the dopamine singlet with the spectrum range from 6.61 ppm to 6.89 ppm.
Figure 3:
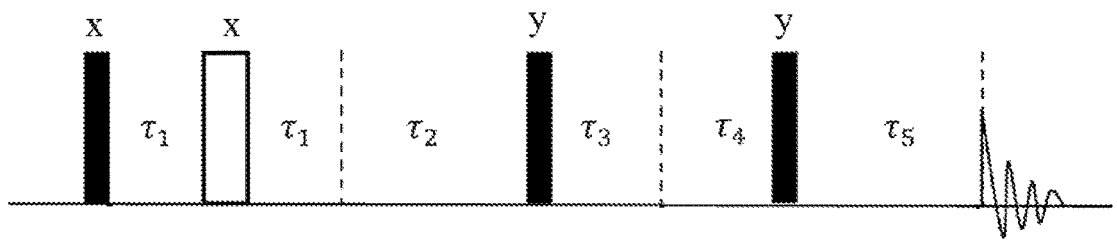
FIG. 3 is the scheme of the pulse sequence for the singlet preparation of dopamine. The black rectangle represents a 90-degree hard pulse, and the white square represents a 180-degree hard pulse. x and y represent the phases of the radio frequency (RF) pulses. $\tau_1$-$\tau_5$ is the time for the spin evolution.

The pulse form of the two-spin system singlet prepared in the weakly coupled system is as shown in FIG. 3b 1. After applying a 90-degree hard pulse along the x direction, the density operator can be written as:

$$\hat{\rho}_1 = \hat{u}_x\left(\frac{\pi}{2}\right)\hat{\rho}_0\hat{u}_x^*\left(\frac{\pi}{2}\right)$$

2. After the evolution through time of $\tau_1$, the density operator becomes:

$$\hat{\rho}_2 = \hat{u}(\tau_1)\hat{\rho}_1\hat{u}^*(\tau_1)$$

3. After applying a 180-degree hard pulse along the x direction, the density operator becomes:

$$\hat{\rho}_3 = \hat{u}_x(\pi)\hat{\rho}_2\hat{u}_x^*(\pi)$$

4. After the evolution through time of $\tau_1+\tau_2$, the density operator becomes:

$$\hat{\rho}_4 = \hat{u}(\tau_1+\tau_2)\hat{\rho}_3\hat{u}^*(\tau_1+\tau_2)$$

5. After applying a 90-degree hard pulse along the y direction, the density operator becomes:

$$\hat{\rho}_5 = \hat{u}_y\left(\frac{\pi}{2}\right)\hat{\rho}_4\hat{u}_y^*\left(\frac{\pi}{2}\right)$$

6. After the evolution through time of $\tau_3$, the density operator becomes:

$$\hat{\rho}_6 = \hat{u}(\tau_3)\hat{\rho}_5\hat{u}^*(\tau_3)$$

Wherein, $$\tau_3 = \frac{\tau_2}{2}$$

The function of this pulse is to prepare the singlet state of the three-spin system consisting of three $^1H$ on the benzene ring of dopamine. It can be named as the preparation pulse for short.

After the evolution under the operation operators of Hamilton and hard pulse, the targeted operator of the singlet state is:

$$\hat{Q} = \frac{1}{\sqrt{3}}\left(\hat{I}_{1x}\hat{I}_{3x} + \hat{I}_{1y}\hat{I}_{3y} + \hat{I}_{1z}\hat{I}_{3z}\right) + \frac{1}{\sqrt{3}}\left(\hat{I}_{2x}\hat{I}_{3x} + \hat{I}_{2y}\hat{I}_{3y} + \hat{I}_{2z}\hat{I}_{3z}\right)$$

After the evolution under the operation operators of hard pulse and Hamilton, the trace of the product of $\hat{\rho}_6$ and the target operator $\hat{Q}$ yields the projection on the singlet state:

$$S = \text{trace}(\hat{Q}\hat{\rho}_6)$$

Wherein, S represents the conversion efficiency of the singlet state. In order to maximize the singlet state conversion efficiency, it is needed to use MATLAB to perform a simulation to obtain the appropriate parameters. Firstly, writing the above formulas into MATLAB scripts respectively; then continuously optimize the values of $\tau_1$, $\tau_2$ through programming, so that the singlet state conversion efficiency (the absolute value of S) reaches the optimal value. After optimizing, $\tau_1=30.9$ ms, $\tau_2=6.8$ ms, and the singlet efficiency can reach the optimal value.

Because the single state is not a single quantum signal, and the spin singlet cannot be directly detected in the NMR instrument. It is necessary to apply the detection pulse in order to detect the singlet state signals. The detection pulse form is as follows:

1. After the evolution through time of $\tau_4$, the density operator becomes:

$$\hat{\rho}_7 = \hat{u}(\tau_4)\hat{Q}\hat{u}^*(\tau_4)$$

2. After applying a 90-degree hard pulse along the y direction, the density operator becomes:

$$\hat{\rho}_8 = \hat{u}_y\left(\frac{\pi}{2}\right)\hat{\rho}_7\hat{u}_y^*\left(\frac{\pi}{2}\right)$$

3. After the evolution through time of $\tau_5$, the density operator becomes:

$$\hat{\rho}_9 = \hat{u}(\tau_5)\hat{Q}\hat{u}^*(\tau_5)$$

If using the quantum state after the singlet preparation as the initial state, to have the best-optimized singlet preparation efficiency, the target quantum state is:

$$\hat{P} = \frac{1}{2}(\hat{I}_{1x}\hat{I}_{3z}+\hat{I}_{1z}\hat{I}_{3x}) + \frac{1}{2}(\hat{I}_{2x}\hat{I}_{3z}+\hat{I}_{3x}\hat{I}_{2z})$$

Similarly, after the detection pulse, the trace of the product of $\hat{\rho}_9$ and the target quantum state $\hat{P}$ yields the projection of the final state on the target quantum state:

$$R = \text{trace}(\hat{P}\hat{\rho}_9)$$

Wherein, R represents the conversion efficiency of the target quantum state. In order to achieve the maximum value of R, $\tau_4$ and $\tau_5$ need to be continuously optimized by MATLAB to maximize the absolute value of R. After optimizing, $\tau_4$=3.3 ms, $\tau_5$=6.8 ms.

After calculation, the complete pulse sequence to prepare and detect the three-spin system of dopamine is obtained by combining the pulse form of the two-spin system singlet under the weakly coupled system and the calculated pulse parameters.

Figure 4:
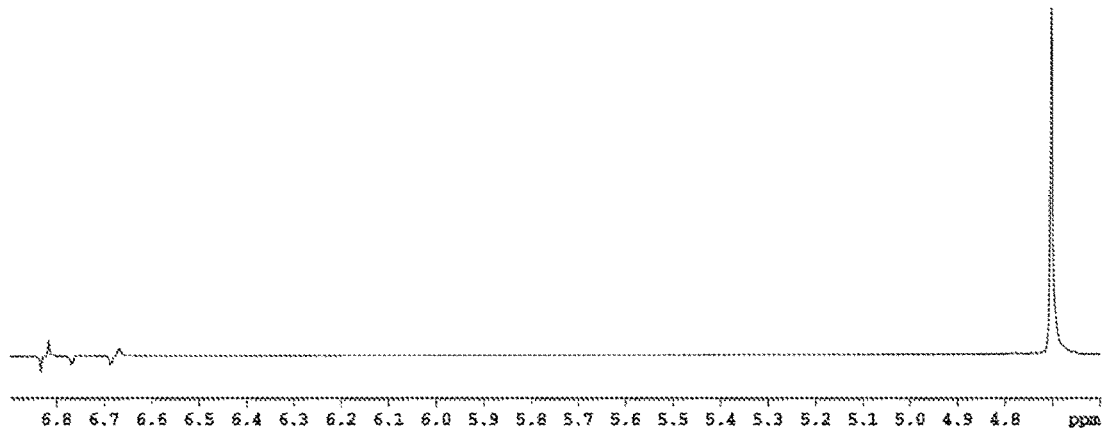
FIG. 4 is the $^1$H NMR spectrum obtained through preparing and detecting the singlet states of the dopamine in Example 1. The pulse sequence in FIG. 3 is used to acquire the spectrum.

Step 3: The complete pulse obtained in Step 2 is written into the computer by NMR instrument language; then, a $D_2O$ aqueous solution of dopamine is put into the NMR instrument, and then the field-locking, field-shimming, matching, and tuning are performed; finally, the radio frequency center of the transmitter is set to the three $^1H$ on the benzene ring of dopamine, and the complete pulse written into the computer is applied to prepare and detect the singlet states of dopamine. The detected NMR spectrum of dopamine is shown in FIG. 4. The three signals on the left are from the three protons on the dopamine benzene ring, and the right is the water signal in deuterium water. It can be seen that after the singlet preparation and detection, the signal intensity of water in deuterium water is still far greater than the signal of dopamine, and selective filtering has not been achieved. Therefore, it is needed to be improved on the basis of preparing single states.

The pulse sequence for preparing the spin singlets of dopamine can be designed according to actual needs, and different preparation singlet pulse sequences can be used to realize the singlet preparation of dopamine.

Step 4: Based on the preparation and detection of singlet state in Step 3, a new high power CW pulse and two gradient field pulses with different amplitudes are applied between the pulses for the singlet preparation and the pulses for the signal detection, these pulses form are shown in FIG. 5. The pulses before b are the preparation module of the dopamine singlet. The CW pulse and two gradient field pulses with different amplitudes are applied in the period between b and c. The pulses after c are the module to detect the singlet of dopamine. Wherein, the duration of the CW pulse is 100 ms, the amplitude is 3 watts. Two gradient field pulses with different amplitudes require a duration of 1 ms, an amplitude of 5 Gauss/cm along the z direction. In the process, the duration and amplitude of CW are needed to be optimized in order to achieve the best filtering effect, that is, filtering out non-singlet signal components while keeping the three $^1H$ signals from the benzene ring of dopamine. The experimental result is shown in FIG. 6. The three signals on the left are from the three $^1H$ on the dopamine ring, and the signal on the right is the water signal in deuterium water. The signal intensity of water in deuterium water is much smaller than the signal of dopamine molecules after applying the CW decoupling pulse and two gradient field pulses with different amplitudes between the preparation module of the spin singlets and the module of spin singlet detection. This achieves selectively filtering.

Example 2

NMR Instrument: Bruker AVANCE III 500 NMR spectroscopy.

Figure 7:
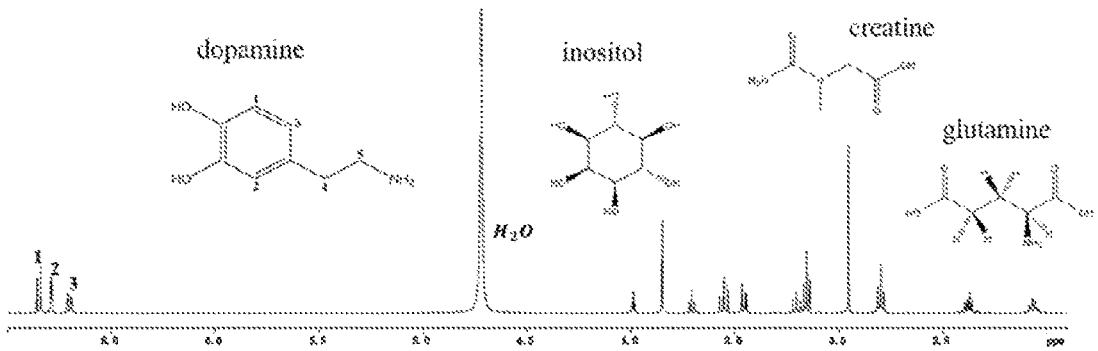
FIG. 7 is the $^1$H NMR spectrum of a mixture aqueous solution sample. The solute in this sample is a mixture consisting of dopamine, creatine, inositol, and glutamine.

The example was carried out as follows:

Step A: Prepare an aqueous solution of dopamine, creatine, inositol, and glutamine with a mass fraction of 1.5% for each solute. $D_2O$ instead of $H_2O$ is used to prepare the solution. The $^1H$ NMR spectrum of the sample is shown in FIG. 7. Analyze the $^1H$ NMR spectrum and make the signal assignment. The leftmost signals are from the three protons on the benzene ring of dopamine. The middle signal at 4.7 ppm is assigned to the water (HDO). The $^1H$ signals in the right side of the spectrum are from the ethyl group of dopamine, and the groups of creatine, inositol, and glutamine. If setting the center frequency between peaks 1 and 3 to zero (see FIG. 7), the resonance frequencies and J coupling values of peaks 1, 2 and 3 are:

$$\omega_1 = 36.5 \text{ Hz}, \omega_2 = -7.8 \text{ Hz}, \omega_3 = -36.5 \text{ Hz};$$

$$J_{12} = 0 \text{ Hz}, J_{13} = 8.14 \text{ Hz}, J_{23} = 2.18 \text{ Hz}.$$

Step B: Because the resonance frequencies and J coupling values of peaks 1, 2 and 3 have not been changed in the complex system, and the spin Hamiltonian thus remains unchanged too. The pulse sequence in FIG. 5 was directly used in the experiments in this example.

Step C: This step is similar to Step C in Example 1. The parameters used in the experiments are the same as those used in Example 1. The spectrum in FIG. 8 was obtained.

This embodiment comprises the following steps:

The instrument used in this embodiment is Bruker AVANCE III 500 NMR spectroscopy.

The specific steps from the preparation of the spin singlet of dopamine to the realization of the signal filtering are as follows:

Steps 1: Prepare an aqueous solution of dopamine, creatine, inositol, and glutamine with a mass fraction of 1.5% for each solute. Put the solution sample into an NMR instrument. After applying a 90-degree hard pulse, the signals of dopamine as shown in the $^1H$ spectrum in FIG. 7 can be obtained. In the spectrum, the leftmost signals are the three $^1H$ on the benzene ring of dopamine. The middle signal at 4.7 ppm is assigned to the water (HDO). The $^1H$ signals in the right side of the spectrum are from the ethyl of dopamine, and the groups of creatine, inositol and glutamine. The J coupling values between the protons of the system and the corresponding chemical shifts read as:

$$\omega_1 = 36.5 \text{ Hz}, \omega_2 = -7.8 \text{ Hz}, \omega_3 = -36.5 \text{ Hz};$$

$$J_{12} = 0 \text{ Hz}, J_{13} = 8.14 \text{ Hz}, J_{23} = 2.18 \text{ Hz}$$

Step 2: Because the chemical shifts and J coupling values of peaks 1, 2 and 3 have not been changed in the complex system, and the spin Hamiltonian thus remains unchanged too. The complete pulse sequence of Step 2 of Example 1 can be directly used, which is composed of the pulse sequence for preparing the singlet state of the two-spin system and the calculated pulse parameters under the weakly coupled system.

Figure 9:
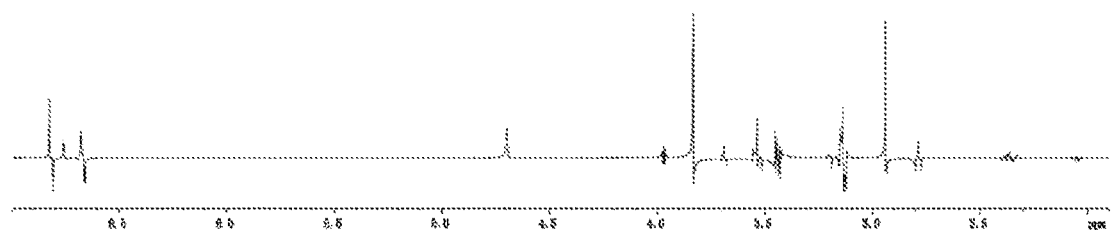
FIG. 9 is the $^1$H NMR spectrum is obtained by preparing and detecting the spin singlets of dopamine in the complex system in Example 2 of this invention.

Step 3: Similar to Step 3 in Example 1, applying the pulse, which has been written into the computer, to prepare and detect the spin singlet of dopamine. The detected dopamine NMR spectrum is shown in FIG. 9. The intensity of signals of the three protons from the benzene ring of the dopamine molecule at the far left barely changes. But the phase of the signals changes. The signal at 4.7 ppm is the water signal, which has been suppressed greatly. The $^1$H signals in the right side of the spectrum are from the ethyl of dopamine, the groups of creatine, inositol and glutamine. The intensity of these signals changed. But compared with that of dopamine, these signals are still higher than those of dopamine. In general, compared with the $^1$H NMR spectrum (FIG. 7), the intensity of the other non-singlet signals in the spectrum is suppressed to a certain extent, but the effect is not obvious except for the water signal.

Figure 8:
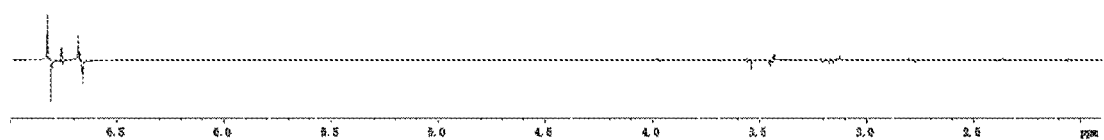
FIG. 8 is the $^1$H NMR spectrum of a mixture aqueous solution sample. The solute in this sample is a mixture consisting of dopamine, creatine, inositol, and glutamine. After using the pulse sequence which has adding the gradient field pulses and the high power CW decoupling pulse on the basis of the original pulse sequence, the $^1$H NMR spectrum can be obtained by preparing and detecting the spin singlets of dopamine in the mixture aqueous solution sample; The pulse sequence in FIG. 5 is used to acquire the spectrum. In this spectrum, except the signals from the benzene ring of dopamine, all other signals are greatly suppressed.

Step 4: Based on the preparation and detection of singlet state in Step 3, a new high power CW pulse and two gradient field pulses with different amplitudes are added between the preparation module of the spin singlets and the module of spin singlet detection. These pulses are shown in FIG. 5. The pulses before b belong to the preparation module of the spin singlets of dopamine. The pulses between b and c are the newly applied CW pulse and the two gradient field pulses with different amplitudes. The pulses after c are the module of spin singlet detection. Wherein, the duration of the CW pulse is 100 ms, the amplitude is 3 watts. Two gradient field pulses with different amplitudes require a duration time of 1 ms, with an amplitude of 5 Gauss/cm along the z direction. The results are shown in FIG. 8. The $^1$H signals which are from the benzene ring of dopamine at the far left of the spectrum show a clear decay, and meanwhile, the phases of the signals change. The signal at 4.7 ppm is the water signal and the signal intensity is almost 0. Calculation shows that compared with the water signal in the $^1$H spectrum, the height of the residual water signal is less than 0.1%. The $^1$H signals in the right side of the spectrum are from the ethyl of dopamine, the groups of creatine, inositol and glutamine. The intensities of these signals are obviously changed. Comparing with the $^1$H signals which are from the benzene ring of dopamine, their intensities are almost negligible. In summary, the other non-singlet signals in the spectrum are almost completely suppressed in the signal intensity compared with the $^1$H spectrum (FIG. 9). In particular, the signal of water is almost attenuated to 0 in intensity, and only the signals from the singlets of dopamine are retained, realizing the selective detection of the dopamine signals in this mixed system.

The present invention discloses a method for selectively detecting dopamine molecules based on the magnetic resonance nuclear spin singlet. The method utilizes the nuclear spin singlet of the three $^1$H spins on the benzene ring of dopamine to realize the selective detection of dopamine signals in complex systems. The present invention detecting dopamine by the magnetic resonance technique, has good accuracy, sensitivity and selectivity, and can accurately detect dopamine signals from a system having complex components, and meanwhile can well eliminate the interference of signals from the other substances. At the same time, the present invention has the advantages of simple operation and non-intervention, and thus can be used to monitor the amount and distribution of the dopamine molecules in a living body. Thus this invention will have important applications in the fields of biology and medicine.

The content described above is only the preferred embodiments of the present invention. The skilled persons in the field may modify or equivalently make some substitution within the spirit of the present invention. All changes made in accordance with the spirit of the present invention should fall within the scope of protection claimed by the present invention.

What is claimed:

1. A method for selectively detecting dopamine molecules based on nuclear magnetic resonance (NMR) spin singlet comprising:
   step A: obtaining chemical shifts and J coupling values of three $^1$H spins on the benzene ring of dopamine in a test sample;
   step B: according to the spin characteristics of dopamine, design a pulse sequence that utilizes the nuclear spin singlet states to realize the selection of dopamine signals;
   wherein the designed pulse sequence of step B contains a preparation module of the spin singlets of the nuclear spin coupling system of dopamine, and a module to transform the spin singlets to observable signals;
   wherein, in the pulse sequence module module, a 90-degree hard pulse is first-applied along the x direction; after a delay time of $\tau_1$, a 180-degree hard pulse is applied along the x direction; then, a delay time of $(\tau_1+\tau_2)$ is applied, followed by a 90-degree hard pulse along the y direction, and then a delay time of $\tau_3$ is applied;
   from the start of the pulse sequence to the end of $\tau_3$, the pulse sequence module is used to prepare the spin singlets of the three $^1$H spin system on the benzene ring of dopamine;
   after $\tau_3$, a delay time of $\tau_4$ is applied, followed by a 90-degree hard pulse along the y direction and then a delay time of $\tau_5$ is applied;
   this pulse sequence module is used to transform the spin singlets into the observable signals;
   in the designed pulse sequence, the values of $\tau_1$, $\tau_2$, $\tau_3$ are able to affect the efficiency of the singlet preparation of the three $^1$H spins on the benzene ring of dopamine;
   in order to maximize the singlet preparation efficiency, optionally optimizing $\tau_1$, $\tau_2$, and $\tau_3$; wherein $\tau_4$ and $\tau_5$ are related to the dopamine signals for final detection;
   in order to maximize the final detection signals, $\tau_4$ and $\tau_5$ are optionally maximized;
   step C: preparing the spin singlet states of the three $^1$H spin coupling system on the benzene ring of dopamine by the designed pulse sequence; applying a gradient field pulse during the existence of the spin singlets to remove other signals except the spin singlet in the sample, resulting in the targeting selection of dopamine signal.

2. The method of claim 1, wherein the purpose of step A is to obtain the nuclear spin coupling characteristics of dopamine molecules by analyzing the NMR spectrum of the test sample.

3. The method of claim 1, wherein the designed pulse sequence of step B comprises the pulse sequence module in which the gradient field pulses are applied during the evolution of the nuclear spin singlets to remove all other NMR signals except the nuclear spin singlets; from the start of the pulse sequence to the end of $\tau_3$ is the pulse sequence module for the singlet preparation; after this pulse sequence module, the first gradient field pulse, $g_1$, is applied, then there is the singlet evolution stage; in the singlet evolution stage, optionally applying a decoupling pulse to minimize the influence of the environmental factors on the spin singlets evolution; optionally applying a second gradient field pulse $g_2$ after the decoupling period to better remove all of the other NMR signals except the spin singlets.

4. The method of claim 1, wherein the method specifically comprises the following steps:
   step 1: putting a $D_2O$ aqueous solution with a mass fraction of 2%-5% dopamine in a magnetic resonance instrument, and applying a 90-degree hard pulse to the $D_2O$ aqueous solution of dopamine, which makes the $^1H$ signals excited, then obtain the $^1H$ spectrum of dopamine, and in turn the chemical shifts of three $^1H$ spin coupling system on the benzene ring of dopamine and the J coupling values among the protons;
   step 2: according to the pulse form of preparing the singlets from the two-spin system of the weakly coupled system, for the three-spin system consisting of three $^1H$ atoms on the benzene ring of dopamine, the pulse parameters for the preparation and detection of dopamine singlet in the three-spin system are calculated based on chemical shifts and J coupling values obtained from step 1 by using MATLAB; as a result, the pulse sequence to prepare the nuclear spin singlet states of three $^1H$ atoms on the dopamine benzene ring with the maximum efficiency can be obtained;
   step 3: obtaining the complete pulse sequence by combining the pulse form to prepare the singlet of the two-spin system of the weakly coupled system and the pulse parameters required for the preparation and detection of dopamine singlet in the three-spin system calculated in step 2, which is applied to the dopamine $D_2O$ aqueous solution to prepare and detect the singlet of the three-spin system consisting of three $^1H$ on the benzene ring;
   step 4: applying two gradient field pulses with different amplitudes and a continuous wave (CW) decoupling pulse between the pulses for the singlet preparation and the pulses for the signal detection to form a new pulse sequence on the basis of preparation and detection of dopamine singlet in step 3; the function of the new pulse sequence can be divided into three parts: the first part is to obtain the singlets of the three $^1H$ on the benzene ring of dopamine; the second part is to keep the singlet states of three $^1H$ on the benzene ring of the dopamine and filter the other non-single state signals because the nuclear spin singlet state is not affected by the gradient field pulses and the CW decoupling pulse; the third part is to detect the singlet states of three $^1H$ on the benzene ring; in the end, only the three $^1H$ signals on the benzene ring are kept, achieving the purpose of selective signal filtering; in this process, it is necessary to continuously optimize the time of the CW pulse to achieve the best filtering efficiency.

5. The method of claim 4, wherein for the $^1H$ spectrum of dopamine described in step 1, the three signals on the left side represent the three $^1H$ signals on the benzene ring, the single peak in the middle is the water signal, and the ethyl signal of dopamine is on the right side; the J coupling values and chemical shifts between the three $^1H$ atoms on the benzene ring of dopamine are obtained from the $^1H$ spectrum of dopamine.

6. The method of claim 4, wherein step 2 is as follows: firstly, a 90-degree hard pulse is applied along the x direction; after a delay time of $\tau_1$, a 180-degree hard pulse is applied along the x direction; then, a delay time of $(\tau_1+\tau_2)$ is applied, followed by a 90-degree hard pulse along the y direction, and then a delay time of $\tau_2/2$ namely $\tau_3$ is applied; the function of this pulse is to prepare the singlet states of three $^1H$ on the benzene ring of dopamine, which is called a preparation pulse;
   applying a detection pulse to detect the singlets of the three $^1H$ of three-spin system on the benzene ring of dopamine; wherein the form of the detection pulse is as follows, after a delay time of $\tau_4$, followed by a 90-degree hard pulse along the y direction a delay time of $\tau_5$ is applied; next, an ADC sample is taken immediately until sampling signal decay is completed; wherein in this process, the values of $\tau_1$ and $\tau_2$ impact the efficiency of the singlet states consisting of three $^1H$ atoms on the benzene ring of dopamine;
   in order to maximize the efficiency of the singlet states, optionally using MATLAB software to calculate the values of $\tau_1$ and $\tau_2$; wherein, 64 basic operators of the three-spin system are constructed in the MATLAB script, the Hamiltonian of the three-spin system consisting of three $^1H$ atoms on the benzene ring of dopamine is written; and the operating operators corresponding to the 90-degree hard pulse and the 180-degree hard pulse are obtained; wherein the system is continuously evolving from the thermal equilibrium signals under the operating operator and Hamiltonian of the hard pulse, and the evolution time $\tau_1$ and $\tau_2$ are continuously optimized to maximize the singlet states preparation efficiency; and, on the basis of generating singlet states, evolution time $\tau_4$ and $\tau_5$ are optimized to maximize the singlet states detection efficiency;
   obtaining the complete pulse to prepare and detect three-spin system singlet states of dopamine by combining the pulse form of the two-spin system singlet of the weakly coupled system and the calculated pulse parameters.

7. The method of claim 4, wherein in step 3, the singlet state of the three-spin system consisting of three $^1H$ atoms on the benzene ring of dopamine is prepared and detected added to the computer by the NMR instrument language the complete pulse obtained in step 2 adding the $D_2O$ aqueous solution of dopamine into the magnetic resonance instrument, and performing then field-locking, field-shimming, matching, and tuning; wherein the radio frequency center of the transmitter is set to the three $^1H$ on the benzene ring of dopamine, and the complete pulse written into the computer is applied to prepare and detect the singlet states of the dopamine.

8. The method of claim 4, wherein in step 4, the CW decoupling pulse and two gradient field pulses with different amplitudes are applied between the pulses for the singlet preparation and the pulses for the signal detection to form a new pulse module; wherein, the duration of the CW pulse is between 50 ms and 1 s; the amplitude varies from 1 watt to 15 watts; the duration of each of the two gradient field pulses with different amplitudes along the z direction is between 1 ms and 5 ms, with the amplitude varying from 5 to 10 Gauss/cm; wherein the new pulse module including the CW decoupling pulse and the two gradient field pulses with different amplitudes is added to the computer by the NMR instrument language; field-locking, field-shimming, matching, and tuning are performed; the radio frequency center of the transmitter is set to the three $^1H$ on the dopamine benzene ring, and the new pulse sequence which has been added to the computer including the CW decoupling pulse and the two gradient field pulses with different amplitudes is applied to prepare and detect the singlet states of dopamine.

9. The method of claim 1, wherein the three $^1H$ spin coupling system on the benzene ring of dopamine is prepared into the nuclear spin singlets in step C; there is a plurality of multiple spin systems in a dopamine molecule;

and the spin system formed by the three $^1$H spins on the benzene ring of dopamine is prepared for the nuclear spin singlets.

10. The method of claim 3, wherein the method comprising the following steps:
- step 1: putting a D$_2$O aqueous solution with a mass fraction of 2%-5% dopamine in a magnetic resonance instrument, and applying a 90-degree hard pulse to the D$_2$O aqueous solution of dopamine, to make the $^1$H signals excited, obtaining the $^1$H spectrum of dopamine, and in turn the chemical shifts of three $^1$H spin coupling system on the benzene ring of dopamine and the J coupling values among the protons;
- step 2: calculating pulse parameters for the preparation and detection of dopamine singlet in the three-spin system based on chemical shifts and J coupling values obtained from step 1 by using MATLAB according to the pulse form of preparing the singlets from the two-spin system of the weakly coupled system, for the three-spin system consisting of three $^1$H atoms on the benzene ring of dopamine, the to obtain the pulse sequence to prepare the nuclear spin singlet states of three $^1$H atoms on the dopamine benzene ring with the maximum efficiency;
- step 3: obtaining the complete pulse sequence by combining the pulse form to prepare the singlet of the two-spin system of the weakly coupled system and the pulse parameters required for the preparation and detection of dopamine singlet in the three-spin system calculated in step 2, which is applied to the dopamine D$_2$O aqueous solution to prepare and detect the singlet of the three-spin system consisting of three $^1$H on the benzene ring;
- step s 4: applying two gradient field pulses with different amplitudes and a continuous wave (CW) decoupling pulse between the pulses for the singlet preparation and the pulses for the signal detection to form a new pulse sequence on the basis of preparation and detection of dopamine singlet in step 3, wherein two gradient field pulses with different amplitudes and a continuous wave (CW) decoupling pulse are applied between the pulses for the singlet preparation and the pulses for the signal detection to form a new pulse sequence; the function of the new pulse sequence can be divided into three parts: the first part is to obtain the singlets of the three $^1$H on the benzene ring of dopamine; the second part is to keep the singlet states of three $^1$H on the benzene ring of the dopamine and filter the other non-single state signals because the nuclear spin singlet state is not affected by the gradient field pulses and the CW decoupling pulse; the third part is to detect the singlet states of three $^1$H on the benzene ring; in the end, only the three $^1$H signals on the benzene ring are kept, achieving the purpose of selective signal filtering; wherein the time of the CW pulse is continuously optimized to achieve the best filtering efficiency.

* * * * *